United States Patent [19]

Krounbi et al.

[11] Patent Number: 5,532,109
[45] Date of Patent: Jul. 2, 1996

[54] AZO DYES AS ADHESION PROMOTION ADDITIVE IN POLYDIMETHYLGLUTARIMIDE

[75] Inventors: Mohamad T. Krounbi; Alfred F. Renaldo, both of San Jose; Douglas J. Werner, Fremont, all of Calif.

[73] Assignee: International Business Machines Corporation, Armonk, N.Y.

[21] Appl. No.: 542,479

[22] Filed: Oct. 13, 1995

Related U.S. Application Data

[63] Continuation of Ser. No. 180,588, Jan. 12, 1994, abandoned.
[51] Int. Cl.⁶ .................................................. G03F 7/26
[52] U.S. Cl. ......................... 430/271; 430/311; 430/330
[58] Field of Search ................................. 430/271, 311, 430/329, 330

[56] References Cited

U.S. PATENT DOCUMENTS 4,814,258  3/1989  Tam .......................................... 430/315
5,262,500  11/1993  Chiang ...................................... 430/331

FOREIGN PATENT DOCUMENTS 341843  4/1989  European Pat. Off. .......... G03F 7/02

*Primary Examiner*—Kathleen Duda
*Attorney, Agent, or Firm*—Leslie G. Murray

[57] ABSTRACT

In a bi-layer lift-off process, the adhesion characteristics of a PMGI release layer are substantially improved by the use of ortho-hydroxy substituted 4-phenylazo compounds (azo dyes), a class of nonactinic dyes, as an adhesion promoter additive. These azo dyes, due to their chemical structure, exhibit selective binding to various metals by acting as a chelating ligand to the metal surface. Formulations of a specific azo dye, Sudan Orange G, at concentrations from 0.25 to 1.0 percent (by weight) in PMGI exhibits no loss of adhesion at prebake temperatures in the range of 120 to 160 degrees C.

9 Claims, 2 Drawing Sheets

5,532,109

AZO DYES AS ADHESION PROMOTION ADDITIVE IN POLYDIMETHYLGLUTARIMIDE

This is a continuation of application Ser. No. 08/180,588, filed on Jan. 12, 1994, now abandoned.

BACKGROUND OF THE INVENTION

The present invention relates generally to a process of forming patterned structures on a substrate utilizing a bi-layer metal lift-off technique and, more particularly, to the use of azo dyes as an additive to polydimethylglutarimide (PMGI) to improve adhesion of the PMGI layer applied to an underlaying substrate.

The use of a bi-layer resist lift-off process in the fabrication of integrated circuit components and other thin film structures such as field effect transistors (FET), conductor patterns and magnetic sensing transducers, for example, is well know in the art. For example, U.S. Pat. No.4,814,258 granted to Tam discloses a bi-layer lift-off process utilized for the fabrication of various types of FETs, and European Patent Application No. 0 341 843 published Nov. 15, 1989 discloses a bi-layer metal lift-off process for forming conductor patterns on a substrate.

Basically, the bi-layer lift-off system comprises a release layer formed on a suitable substrate which is then covered by a top imaging layer of photoresist. A Diazonapthoquinone (DNQ)/Novolac positive resist is suitable for use as the top imaging layer. Polydimethylglutarimide (PMGI), a polymer supplied by the Shipley Company, is a suitable material for the release layer. The top imaging layer is exposed and developed to provide the desired pattern. The release layer is then flood exposed and developed to expose the substrate surface for subsequent deposition of the desired structural features. During the development step, the release layer is undercut from the edges of the resist pattern a desired amount to facilitate the subsequent lift-off step.

A major difficulty and limitation of the bi-layer lift-off process utilizing PMGI as the release layer is the loss of or reduced adhesion of the PMGI layer to the underlaying substrate surface at lower prebake temperatures. Good adhesion of PMGI to various substrate materials has been obtained by oven baking at temperatures in the range of 190 to 290 degrees C., near or above the glass transition temperature for the PMGI resin. However, bake temperatures below 150 degrees C. have resulted in, at best, marginal adhesion characteristics. The relatively high prebake temperatures required for suitable adhesion in PMGI systems can result in oxidation of the underlaying deposition surface, particularly certain metals, further resulting in reduced yields and degraded performance of the finished product.

SUMMARY OF THE INVENTION

In a bi-layer lift-off process according to the principles of the present invention, the adhesion characteristics of a PMGI release layer are substantially improved by the use of ortho-hydroxy substituted 4-phenylazo compounds (azo dyes), a class of nonactinic dyes, as an adhesion promoter additive. These azo dyes, due to their chemical structure, exhibit selective binding to various metals by acting as a chelating ligand to the metal surface. In a preferred embodiment, formulations of a specific azo dye, Sudan Orange G, at concentrations from 0.25 to 1.0 percent (by weight) in PMGI exhibits no loss of adhesion at prebake temperatures in the range of 120 to 160 degrees C.

BRIEF DESCRIPTION OF THE DRAWINGS

The foregoing, and other objects, features and advantages of the invention will be apparent from the following more particular description of the preferred embodiment of the invention, as illustrated by the accompanying drawings, in which like reference numerals indicate like parts and in where.

DETAILED DESCRIPTION OF THE PREFERRED EMBODIMENT

Referring now to FIGS. 1–4, as is known in the art, bi-layer lift-off processes are utilized when it is desired to produce well-defined patterns on a substrate surface by deposition techniques, such as evaporation or sputtering, for example.

Figure 1:
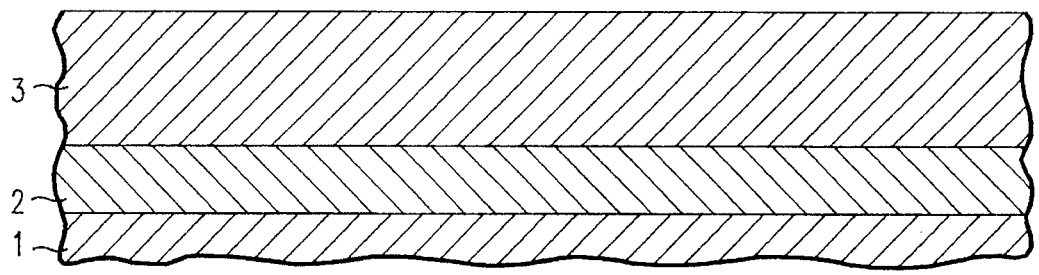
FIGS. 1–4 are cross-sectional views illustrating the structures formed during the steps of a bi-layer lift-off process.
Figure 2:
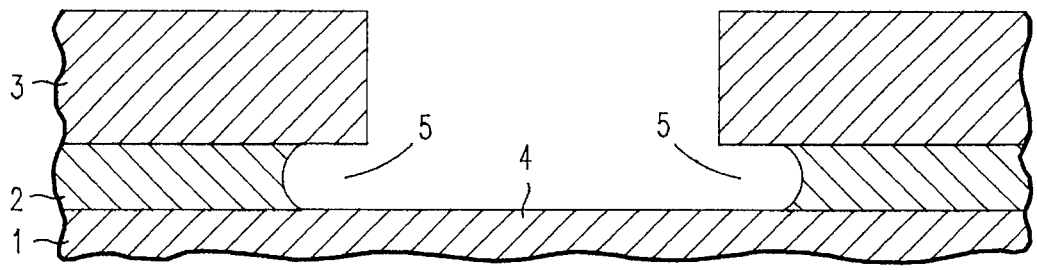
Figure 3:
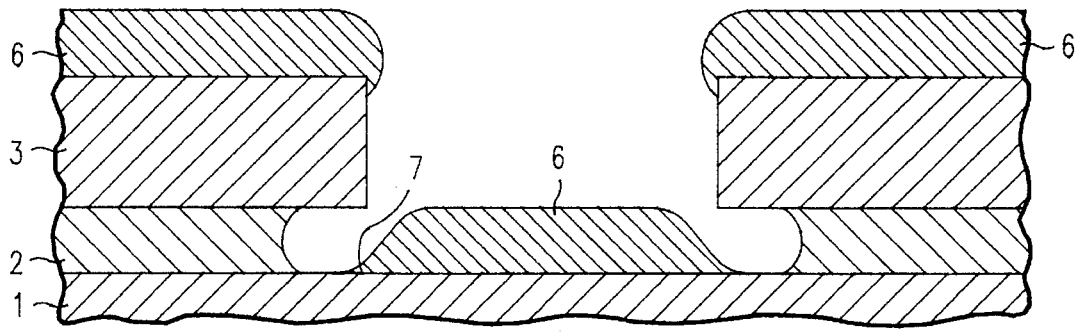
Figure 4:
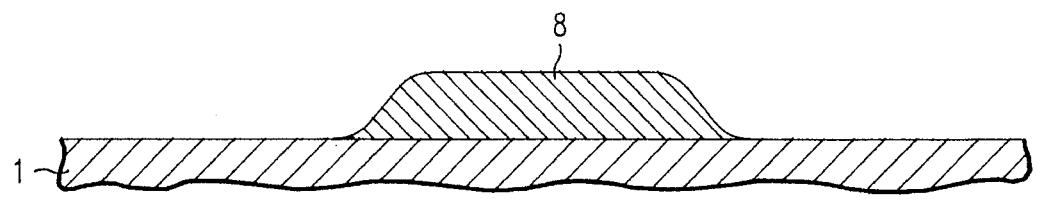

FIG. 1 shows a substrate 1 coated with a release layer 2 of PMGI and then coated with a top imaging layer 3 of a suitable photoresist (referred to as "resist"). Both the resist 3 and the PMGI 2 are then developed, resulting in the structure as shown in FIG. 2 with the substrate surface 4 exposed and the PMGI layer 2 undercut 5 below the resist layer 3. A desired material, such as a conductive metal, is next deposited, such as by sputter deposition, for example, leading to the formation of a layer 6 covering the exposed substrate surface 4 and the top resist layer 3 as shown in FIG. 3. The amount of deposited material 7 extending into the undercut area 5 is primarily determined by the thickness of the PMGI layer 2. Finally, lift-off of the unwanted material 6 deposited over the top resist layer 3 is carried out using, for example, an organic solvent or aqueous alkali to dissolve the PMGI and top resist layers releasing the deposited material 6. The end result is shown in FIG. 4 wherein the substrate 1 has been selectively coated with a patterned metal conductor 8, for example.

Figure 5:
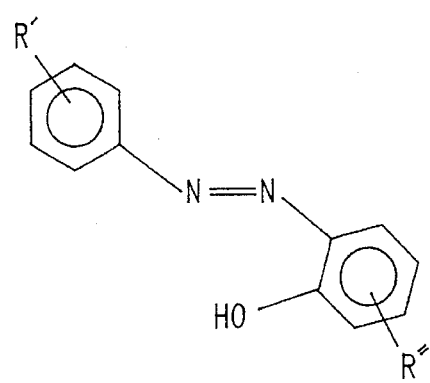
FIG. 5 represents the chemical formula of ortho-hydroxy substituted 4-phenylazo compounds used as an adhesion promoter additive in the present invention.

As described above, a major limitation encountered when using PMGI as the release layer material is loss of adhesion at low prebake temperatures, the low temperatures being required to minimize undesirable oxidation and corrosion of previously formed structural materials. In accordance with the principles of the present invention, the adhesion characteristics of the PMGI are greatly improved by the addition to the PMGI of small amounts of ortho-hydroxy substituted 4-phenylazo compounds (azo dyes). The chemical composition of the azo dyes is illustrated in FIG. 5 wherein R' is hydrogen (H), methoxy ($OCH_3$), methy ($CH_3$), or hydroxyl (OH), for example, and R" is hydrogen (H), methoxy ($OCH_3$), methy ($CH_3$), or hydroxyl (OH), for example. Formulations of a specific azo dye, Sudan Orange G, at concentrations in the range of 0.25 to 1.0 percent (by weight) in PMGI exhibit no loss of adhesion at prebake temperatures ranging from 120 to 160 degrees C. Under stressed conditions, bi-layer resist structures having small feature patterns have shown no loss of adhesion between the substrate and the release layer at concentrations of Sudan Orange G in the PMGI equal to or greater than 0.25 percent (by weight). Additionally, formulations of the azo dyes in PMGI have exhibited a shelf-life of at least twelve months with minimum deterioration of desirable characteristics.

In a preferred embodiment, PMGI (3.0 percent by weight) in cyclohexanone (product no. XP-5020 provided by Shipley Company) was diluted with additional solvent to provide a final concentration of 1.0 percent (by weight) PMGI. Sudan Orange G was added to form a solution wherein Sudan Orange G comprised 20 to 33 percent (by weight) of the total solids in the formulation. A spin cast film of the PMGI formulation approximately 1000 Angstroms (A) thick was formed on a layer of nickel-iron (NiFe) over a titanium carbide-aluminum dioxide (N58) wafer and baked at approximately 160 degrees C. for 1 hour. A 1.0 micrometer (um) film of resist, such as Microposit S3800 series from Shipley Company, for example, was then spun unto the baked PMGI (release) layer at 4000 rpm for 1.0 minute and baked at 95–105 degrees C. for 30 minutes. The bi-layer resist system thus formed was then exposed and developed in an aqueous base developer (Microposit 353 from Shipley Company, for example) at 23 degrees C. with sufficient base concentration and development time to provide an adequate undercut profile 5 for the lift-off process. Scanning Electron Microscope (SEM) inspection of the developed bi-layer resist system showed the desired undercut 5 (as shown in FIG. 2) with no significant change in the top resist layer 3 profile and no loss of adhesion between the PMGI release layer and the NiFe layer. Given a defined bi-layer resist system, the amount of undercut 5 created is a function of the developer concentration and the development time and temperature. Similar bi-layer resist systems prepared on alumina ($Al_2O_3$) coated substrates also exhibited excellent adhesion characteristics. In general, no loss of adhesion was observed for prebake temperatures as low as 115 degrees C.

Figure 6:
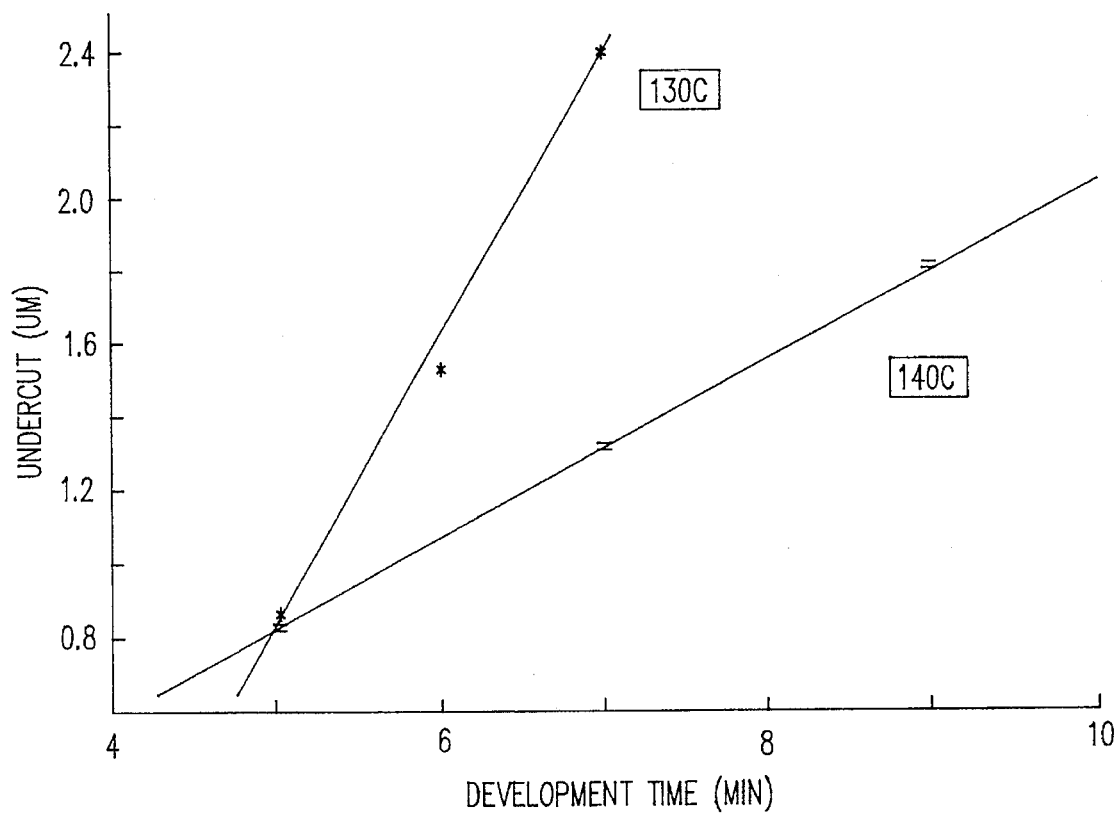
FIG. 6 is a graph illustrating the amount of release layer undercut versus time as a function of prebake temperatures for a release layer according to the present invention.

In a preferred embodiment, the bi-layer resist system of the present invention can be adapted to deposit the electrical lead conductors in a magnetoresistive (MR) sensor. Since in an MR sensor the lead conductors also define the read track width, definition of the lead conductor structure is critical. Definition of the track width is determined by the degree or amount of undercut 5 (as shown in FIG. 2). The amount of undercut 5 also determines the effectiveness of the lift-off process. A long undercut provides the most effective lift-off. For a given set of thicknesses and PMGI composition, the amount of undercut generated is primarily a linear function of the development time and the prebake temperature for the PMGI release layer, the developer concentration and temperature being held constant. FIG. 6 illustrates the amount of undercut achieved as a function of the PMGI development time and the prebake temperature.

For use in the present invention, the PMGI should preferably have a weight average molecular weight (polystyrene as a standard) within the range of 10,000 to 40,000. The choice of the molecular weight depends on the depth of undercut desired for specific applications, which is also a function of developer strength as well as temperature and development time. An absolute weight average molecular weight of approximately 20,000 is most preferred in the examples given above. Additionally, the glass transition temperature ($T_g$) of the PMGI resin should have a value within the range of 140 to 250 degrees C. A $T_g$ of approximately 185 degrees C. is most preferred in the examples given above.

While the present invention has been particularly shown and described with reference to a preferred embodiment thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the appended claims.

We claim:

1. In a method of forming a bi-layer lift-off structure having a release layer of polydimethylglutarimide formed on a substrate and a patterned photoresist layer formed on said release layer, the improvement comprising the steps of:

adding a predetermined amount of a selected azo dye to polydimethylglutarimide, said selected azo dye for promoting adhesion between a release layer of polydimethylglutarimide formed on a substrate and said substrate; and heating said release layer in a prebake step at a predetermined temperature for a predetermined period of time.

2. The method of claim 1 wherein said predetermined amount being an amount required to form a solution wherein said azo dye comprises 0.25 to 1.0 percent by weight of said polydimethylglutarimide.

3. The method of claim 1 wherein said selected azo dye comprises Sudan Orange G.

4. The method of claim 1 wherein said predetermined temperature is a temperature in the range of 120 to 160 degrees C.

5. The method of claim 4 wherein said predetermined time is approximately 1.0 hour.

6. The method of claim 1 wherein said polydimethylglutarimide has a weight average molecular weight within the range of approximately 10,000 to 40,000.

7. The method of claim 6 wherein said polydimethylglutarimide has a weight average molecular weight of approximately 20,000.

8. The method of claim 1 wherein said polydimethylglutarimide has a glass transition temperature within the range of approximately 140 to 250 degrees C.

9. The method of claim 8 wherein said polydimethylglutarimide has a glass transition temperature of approximately 185 degrees C.

* * * * *